United States Patent [19]

Jongetjes

[11] E Re. 31,124

[45] Reissued Jan. 11, 1983

[54] REINFORCED PLASTICS CARRIER FOR PRINTED CIRCUITS

[75] Inventor: Hendrik Jongetjes, Heenskerk, Netherlands

[73] Assignee: Koninklijke Papierfabrieken Van Gelder Zonen N.V., Amsterdam, Netherlands

[21] Appl. No.: 969,363

[22] Filed: Dec. 14, 1978

Related U.S. Patent Documents

Reissue of:

[64] Patent No.: 3,937,865
Issued: Feb. 10, 1976
Appl. No.: 436,669
Filed: Jan. 25, 1974

U.S. Applications:

[63] Continuation of Ser. No. 818,058, Jul. 22, 1977, abandoned, which is a continuation of Ser. No. 196,782, Nov. 8, 1971, abandoned.

[30] Foreign Application Priority Data

Nov. 11, 1970 [NL] Netherlands ..... 7016489

[51] Int. Cl.[3] ..... D21H 5/18

[52] U.S. Cl. ..... 162/156; 162/168.1; 428/413; 428/417; 428/428; 156/62.8; 156/307.7; 156/330

[58] Field of Search ..... 162/156, 168 R, 168.1; 156/62.8, 307, 330; 428/413, 417, 428, 901; 526/10, 11

[56] References Cited

U.S. PATENT DOCUMENTS

| | | | |
|---|---|---|---|
| 3,012,929 | 12/1961 | Jackson | 162/156 |
| 3,200,104 | 8/1965 | Imai et al. | 526/10 |
| 3,544,538 | 12/1970 | Masuda et al. | 526/10 |
| 3,556,754 | 1/1971 | Marsden et al. | 65/3 |
| 3,582,513 | 6/1971 | Bouchard et al. | 260/33.4 R |
| 3,622,445 | 11/1971 | Heidweiller | 162/156 |
| 3,630,831 | 12/1971 | Jongetjes | 162/156 |

OTHER PUBLICATIONS

Benzinger et al., "Properties of Glass Paper Laminates Made with Various Thermosetting Resins", Tappi, vol. 49, #10, p. 460–464, 10–66.

Cakin, J. B., "Modern Pulp & Paper Making", 3rd Ed., Reinhold Pub., NY, NY, 1957, pp. 312–313.

*Primary Examiner*—William F. Smith
*Attorney, Agent, or Firm*—Diller, Ramik & Wight

[57] ABSTRACT

Non-woven glass-fiber webs for reinforcing plastics material carrying printed circuits are produced by the wet process from E-glass fibers bonded with polyvinyl alcohol. The polyvinyl alcohol used is a powder or suspension, has a degree of hydrolization of 98–100%, and a viscosity, as a 4% solution in water of 20° C., of 20–100 cP. Preferably the polyvinyl alcohol has a degree of swelling at 20° C. of between 3 and 8, and in the dry form a particle size of between 50 and 180μ. A plurality of these glass fiber webs are impregnated with a solution of an epoxy resin, arranged as a laminate, then compressed at elevated pressure and temperature to form the final laminate.

6 Claims, No Drawings

REINFORCED PLASTICS CARRIER FOR PRINTED CIRCUITS

Matter enclosed in heavy brackets [ ] appears in the original patent but forms no part of this reissue specification; matter printed in italics indicates the additions made by reissue.

[This is a continuation of Ser. No. 196,782, filed Nov. 8, 1971 now abandoned.] *This application is a continuation of Ser. No. 818,058, 07/22/77, now abandoned; which is a Reissue of Ser. No. 436,699, 01/25/74, now patent 3,937,865; which is a continuation of Ser. No. 196,782, 11/08/71, now abandoned.*

This invention relates to a glass fiber web for insulating sheets and to a glass fiber web reinforced plastics insulating sheet for printed circuits, which kind of plastics insulating sheets are described in an article by Benzinger in "Tappi" 49 no. 10, page 460.

Printed circuits, sometimes referred to as printed wiring, are increasingly being used in the last few years. Generally speaking, they are made of synthetic resin materials coated with metal (usually copper) by removing a part of the metal coating. The remaining metal then constitutes the printed wiring or circuit. Of the various processes required for realizing such a printed circuit, the various possibilities of processing the metal coating have hitherto received by far the most attention. Relatively little literature, however, has so far been devoted to the plastics carrier.

Yet the plastics carrier is of the greatest interest for the ultimate quality and reliability of the whole. Consequently, the carrier must also satisfy strict requirements. In the first place, its dielectrical characteristics must be high, that is to say, the carrier should for example have as low an electrical conductance as possible; second the carrier should have a very good dimensional stability, and third its stiffness should have as high values as possible.

For the last-mentioned reason carriers of pure plastics have been found unsatisfactory, and the art has taken recourse to reinforced plastics in the early stages of the development. The reinforcing material used is generally paper, while for certain uses woven glass fabrics have been used. Paper reinforced plastics, however, generally do not reach the desirable stiffness and stability values at elevated temperatures, while woven glass fabrics are not only extremely expensive, but cause difficulties in the subsequent application to them (impregnation) of the actual plastics and the further processing.

Consequently, the art has looked for a different reinforcing material from paper or glass fabric. One of these substitutes is described in great detail by Benzinger (see supra), namely non-woven glass fiber webs. These non-woven glass fiber webs referred to herein as glass fiber webs, can be made analogously to paper by the wet process on paper-making machines. They have the advantage over paper of having a better insulating capacity and a higher dimensional stability at elevated temperatures. The non-woven webs have the advantage over woven glass fabrics of being considerably cheaper and being more readily impgregnated with plastics. As indicated further by Benzinger, the glass fiber web material is preferably impregnated with an epoxy resin, and the whole is heated under pressure thereby being hardened to a stiff material. The combination of non-woven glass fiber web and epoxy resin has quite reasonably satisfied the standard requirements as regards FR-3 laminates, but failed to meet them as regards G-10 laminates.

In the manufacture of glass fiber webs by the wet process (and indeed also by the dry process), a binder must be used, because otherwise there is insufficient coherence in the web, which would cause it to fall apart when processed with the epoxy or other resins. The binders commonly used are various kinds of latices of butadiene copolymers, polyester resins, melamine or phenol formaldehyde condensates, polyvinyl acetate, and the like. It is striking that Benzinger does not refer to the use of such a binder at all.

It has now been found that the choice of the binder is of decisive influence on the suitability of the fiber webs produced with it for them to be suitable for being processed to satisfactory carrier materials for printed circuits after impregnation with an epoxy resin. In fact, it was found when the above conventional binders were used that either the processing with the epoxy resin gave rise to disintegration of the web, or the resulting material had inadequate dielectrical characteristics. On the other hand, an unconventional binder, namely, a powder or a suspension of polyvinyl alcohol, provided it had a degree of saponification of 98–100% and a viscosity, measured as a 4% aqueous solution at 20° C. of 20–100 cP, surprisingly turned out to be very satisfactory. This result was surprising for one thing because polyvinyl alcohol is not renowned for being a material having good dielectrical characteristics. Moreover, the specifications given clearly differ from those of commercial polyvinyl alcohols most commonly used. For the latter have a degree of saponification of 88–90% and a viscosity of 4–5 cP.

In the manufacture of the subject non-woven glass fiber webs, the starting product is a commercial product in the form of glass fibers made of E glass having a thickness of 5–15$\mu$ and a length of 5–30 mm, coated with preferably 0.5–1.0% of a silane coating. These fibers are dispersed in water with the binder to form a 0.005–0.05% suspension, and processed in this form on a fiber web machine to a non-woven fiber web by dewatering. Machines suitable for this purpose have long since been known. Papermaking machines and rotiformers, for example, are very suitable for this purpose.

The binder, which is preferably used in a proportion of 5–25% calculated on the glass fibers, is, as stated before, constituted by a polyvinyl alcohol. However, not just any polyvinyl alcohol is suitable. Essential requirements are that the degree of hydrolization should be 98–100%, and the viscosity, measured as a 4% solution in water at 20° C., should be between 20 and 100 cP. It has furthermore been found that the particle size of the polyvinyl alcohol used should in the dry form preferably range from 50–180$\mu$, and the degree of swelling at 20° should preferably be between 3 and 8. By the degree of swelling is understood the number of times the dry weight of the polyvinyl alcohol granules which they are capable of retaining after being suspended in a 20-fold excess of water, followed by suction drying 15 minutes later.

When leaving the actual fiber web making machine, i.e. after the dewatering, the binder-containing glass fiber webs mostly have a dry content of 10–50%. This wet material is subsequently heated at preferably 85°–100° C. During this treatment the polyvinyl alcohol granules are dissolved in their own swelling water, and preferably deposit on the fiber crossings. In order for this process to proceed as effectively as possible, it is recommendable during the heat treatment to keep the evaporation of water within tolerable limits. Most suitable, therefore, is heating by infra-red radiators, although other heating devices may be used. Subsequently the temperature is further increased and the water is evaporated, for example, by means of hot air. Owing to the resulting dehydration of the polyvinyl alcohol the latter is hardened and rendered insensitive to moisture. Following the last-mentioned drying process the web has acquired sufficient coherence for it to be wound. Glass fiber webs having a weight of 30–200 $g/m^2$ are preferred.

The resulting glass fiber web can subsequently be processed to form an insulating sheet or carrier sheet for a printed circuit in a known manner by impregnating the web with a solution of a thermosetting synthetic plastics material in a solvent. Suitable thermosetting plastics are phenolformaldehyde, polyester silicone and hydrocarbon resins, but we preferably use epoxy resins. The selection of the solvent depends on the resin applied. When epoxy resins are used, acetone is preferred. The conventional hardening agents and accelerators may be added to the synthetic resin solution. The absorption of resin by the glass fiber web can be very accurately controlled. An absorption of up to 10 times the weight of the web of resin solution is possible (in the case of glass fibers no more than 1–2 times), whereafter the glass:resin ratio can be adjusted by squeezing. The resin-impregnated web is then cut to foils, formed into packs of e.g. 4–30 foils, and pressed to form sheets in a press at high pressure and temperature, while if so desired, for example, on the outer faces, sheets of impregnated woven glass fabric may be supplied.

The resulting insulating sheets are extremely suitable for being provided with a metal foil by a conventional technique, thereby to produce printed wiring or circuitry. In fact, the sheets comply extremely well with all the usual requirements, especially as regards stiffness, dimensional stability, and dielectrical characteristics. An additional advantage over sheets incorporating glass fabrics as the reinforcing material is that they are more suitable for punching and drilling operations.

The invention is illustrated in and by the following examples.

EXAMPLE I 100 g E-glass fibers 6 mm long and $10\pm0.5\mu$ thick, provided with 0.7% of a silane coating, were dispersed in 20 l water in a period of 30 minutes. Subsequently 15 g dry polyvinyl alcohol powder was added with stirring. This powder had a degree of hydrolization of 99.5% and a viscosity of 30 cP (4% in water of 20° C.). 95% of the powder had a particle size ranging between 50 and $180\mu$, and the degree of swelling was 4. The resulting suspension was made up with water to 200 l with stirring, whereafter trial sheets of $50\pm2$ $g/m^2$ were made on a laboratory sheet-forming machine. The moist sheets were heated for 10 minutes at 90° C. (with I.R.) and subsequently dried at a final temperature of 180° C. The resulting fibrous webs were tested for their breaking strengths, binder retention and the conductivity of water in which the web had been kept for 24 hours at 20° C.

| | |
|---|---|
| Breaking strength: | 12.6 kg/5 cm |
| Binder retention: | 93% |
| Conductivity: | 20 $\mu$ S/cm |

EXAMPLE II

Example I was repeated, the only difference being the use of a polyvinyl alcohol powder having a degree of hydrolization of 95%. The values for the particle size, the degree of swelling and viscosity were no different from those of Example I. The values measured with the web were:

| | |
|---|---|
| Breaking strength: | 7.5 kg 5cm |
| Binder retention: | 61% |
| Conductivity: | 20 $\mu$ S/cm |

EXAMPLE III

Example I was repeated, the only difference being the use of a polyvinyl alcohol powder having a viscosity of 5 cP. The values measured with the web were:

| | |
|---|---|
| Breaking strength: | 6.2 kg/5cm |
| Binder retention: | 54% |
| Conductivity: | 20 $\mu$ S/cm |

EXAMPLE IV

Example I was repeated, the only difference being the use of a polyvinyl alcohol having a viscosity of 125 cP. The values measured with the web were:

| | |
|---|---|
| Breaking strength: | 9.8 kg/5cm |
| Binder retention: | 96% |
| Conductivity: | 20 $\mu$ S/cm |

EXAMPLE V

Example I was repeated, the only difference being that the same polyvinyl alcohol as used not in the form of a powder or suspension, but in the form of a 5% solution in water. The values measured with the web were:

| | |
|---|---|
| Breaking strength: | 13.5 kg/5cm |
| Binder retention: | 100% |
| Conductivity: | 68 $\mu$ S/cm |

Examples II–V show that different viscosities and degrees of hydrolization are productive of an insufficiently strong material, and that the use of a dissolved polyvinyl alcohol causes an undue rise in conductivity. Moreover, when reduced to practice on a technical scale, the procedures of Examples II–IV cause difficulties owing to foaming, which gravely jeopardizes the homogeniety of the web. For that matter, the use of a polyvinyl alcohol with different values for the particle size and degree of swelling can also result in some foaming, while the binder is less properly and homogeneously distributed over the web.

EXAMPLE VI

Example I was repeated, the difference being using instead of the polyvinyl powder a 5% dispersion of a polyvinyl acetate copolymer. Of this, about 13 g was applied to 100 g glass fibers. The values measured with the web were:

| | |
|---|---|
| Breaking strength: | 13.2 kg/5cm |
| Binder retention: | 100% |
| Conductivity: | 39 μ S/cm |

These results appear to be fairly favourable, but then the wet strength in acetone turned out to be 1.0 kg/5 cm only. Since acetone is the preferred solvent for the preferred resin, this drawback is of decisive importance. The wet strength in acetone of a web made in accordance with Example I was as high as 12.0 kg/5 cm. Moreover, a fibrous web incorporating a polyvinyl acetate binder was found to be highly temperature-sensitive.

EXAMPLE VII

A web made in accordance with Example I was impregnated with an acetone solution of an epoxy resin, a diamine as a hardening agent and $BF_3$ as an accelerator. This web absorbed 5 times its own weight of impregnating liquid. The web was dried for 10 minutes with air of 150°-160° C. There was thus produced a non-sticking epoxy resin impregnated glass fiber web.

20 of these sheets were laid one on top of the other and compressed to form a pack. This pack was pressed for 10 minutes at 150° C. and a pressure of 10 g/cm$^2$ and subsequently for 2 hours at 170° C. and a pressure of 75 kg/cm$^2$.

The resulting laminate was 1.5 mm thick. The bending stiffness of this laminate (DIN 7735) was 3000 kg/cm$^2$. This is only a fraction less than in the case of a G-10 laminate (3500 kg/cm$^2$). The electrical characteristics of the laminate fully satisfy the DIN standard for a G-10 laminate.

We claim:

1. A process for making an insulating sheet for printed circuits, which comprises the steps of forming a 0.005-0.05% suspension of fibers and particulate binder in water, said fibers being fibers of E glass 5-30 mm long and 5-15μ thick and said binder being a particulate polyvinyl alcohol having a degree of hydrolization of 98-100%, being present in the amount of 5-25% based upon weight of the glass fibers, said binder having a particle size of [50-180 mμ] *50-180μ* and a degree of swelling [of ] *at* 20° C. of 3-8, and having a viscosity measured as a 4% solution in water at 20° C. of 20-100 cP; processing this suspension on a fiber web making machine by dewatering to form a non-woven glass fiber web; drying said glass fiber web by heating to a temperature of 85°-100° C. to dissolve the polyvinylalcohol granules in their own swelling water and subsequently further heating to an increased temperature to evaporate the water and dehydrate and harden the polyvinyl alcohol; impregnating a plurality of said glass fiber webs with a solution of an epoxy resin and hardener in acetone, evaporating the acetone; arranging said plurality of webs as a laminate; and compressing said webs into an insulating sheet laminate at elevated pressure and temperature.

2. The process as defined in claim 1 wherein the binder has a degree of hydrolization of 99.5% and a viscosity of 30 cP and is present in an amount of 15% by weight of glass fiber.

3. A laminate for printed circuit boards, made by the process of claim 1, the electrical characteristics of which fully satisfy the DIN standard for a G-10 laminate.

4. A laminate for printed circuit boards, made by the process of claim 2, the electrical characteristics of which fully satisfy the DIN standard for a G-10 laminate.

*5. A non-woven glass fiber web characterized in that water in which the web has been kept for 24 hours at 20° C. has a conductivity of not more than 20 μS/cm which consists essentially of E-glass fibers having a thickness of 5-15μ and a length of 5-30 mm, and a binder; said web being made by the steps of:*

*(a) forming a 0.005-0.05% suspension in water of said fibers and from 5-25%, based upon weight of the fibers, of said binder in swollen particulate form, said particulate binder being polyvinyl alcohol having a degree of hydrolization of 98-100%, a dry particle size of 50-180μ, a degree of swelling in water at 20° C. of 3-8, and having a viscosity, measured as a 4% solution in water at 20° C., of 20-100 cP;*

*(b) dewatering said suspension on a fiber web making machine to form a wet, non-woven glass fiber web;*

*(c) heating the wet web obtained in step (b) to a temperature sufficient to dissolve said swollen binder particles in their own swelling water; and then*

*(d) further heating the web of step (c) at a temperature sufficient to dry the web and to dehydrate and harden the polyvinyl alcohol binder.*

*6. A process for making a non-woven glass fiber web characterized in that water in which the web has been kept for 24 hours at 20° C. has a conductivity of not more than 20 μS/cm, which comprises the steps of:*

*(a) forming a 0.005-0.05% suspension in water of E-glass fibers of 5-15μ thickness and 5-30 mm length together with from 5-25%, based upon weight of the glass fibers, of particulate polyvinyl alcohol having a degree of hydrolization of 98-100%, a dry particle size of 50-180μ, a degree of swelling in water at 20° C. of 3-8, and having a viscosity measured as a 4% solution in water at 20° C., of 20-100 cP;*

*(b) dewatering said suspension on a fiber web making machine to form a wet, non-woven glass fiber web having swollen particulate binder retained therein;*

(c) heating the wet web of step (b) *to a temperature sufficient to dissolve said swollen binder particles in their own swelling water; and then*

*(d) further heating the web of step (c) at a temperature sufficient to dry the web and to dehydrate and harden the polyvinyl alcohol binder.*

* * * * *